United States Patent
Lu et al.

(10) Patent No.: US 8,835,756 B2
(45) Date of Patent: Sep. 16, 2014

(54) ZINC OXIDE PHOTOELECTRODES AND METHODS OF FABRICATION

(75) Inventors: Yicheng Lu, East Brunswick, NJ (US); Aurelien Du Pasquier, Red Bank, NJ (US); Hanhong Chen, Santa Clara, CA (US)

(73) Assignee: Rutgers, The State University of New Jersey, New Brunswick, NJ (US)

( * ) Notice: Subject to any disclaimer, the term of this patent is extended or adjusted under 35 U.S.C. 154(b) by 939 days.

(21) Appl. No.: 11/963,757

(22) Filed: Dec. 21, 2007

(65) Prior Publication Data

US 2008/0149171 A1 Jun. 26, 2008

Related U.S. Application Data

(60) Provisional application No. 60/876,400, filed on Dec. 21, 2006.

(51) Int. Cl.
| | |
|---|---|
| *H01L 31/0224* | (2006.01) |
| *C23C 16/40* | (2006.01) |
| *H01G 9/20* | (2006.01) |
| *H01L 51/42* | (2006.01) |
| *B82Y 10/00* | (2011.01) |
| *H01L 51/44* | (2006.01) |
| *H01L 31/18* | (2006.01) |
| *H01L 51/00* | (2006.01) |

(52) U.S. Cl.
CPC ..... *H01L 31/022466* (2013.01); *H01L 51/0036* (2013.01); *H01G 9/204* (2013.01); *H01L 51/4233* (2013.01); *H01L 51/0083* (2013.01); *H01L 51/0078* (2013.01); *H01L 51/4266* (2013.01); *H01G 9/2059* (2013.01); *B82Y 10/00* (2013.01); *Y02E 10/542* (2013.01); *Y02E 10/549* (2013.01); *H01L 51/442* (2013.01); *H01L 31/1884* (2013.01); *H01L 51/0047* (2013.01); *H01L 51/0086* (2013.01)
USPC ............................................. 136/263; 427/74

(58) Field of Classification Search
CPC B82Y 10/00; H01L 31/1884; H01L 51/4233; H01L 51/4266; H01L 51/442; H01L 51/0036; H01L 51/0047; H01L 51/0078; H01G 9/204; H01G 9/2059; Y02E 10/549
USPC ......................................................... 136/263
See application file for complete search history.

(56) References Cited

U.S. PATENT DOCUMENTS

| | | | |
|---|---|---|---|
| 6,569,548 B2 | 5/2003 | Yamamoto et al. | |
| 2005/0126628 A1* | 6/2005 | Scher et al. .................. | 136/263 |

(Continued)

FOREIGN PATENT DOCUMENTS

WO      2005017957 A2     2/2005

OTHER PUBLICATIONS

Xu et al., "Growth of Ga-doped ZnO nanowires by two step vapor deposition method", Applied Physics Letters, 2005.*

(Continued)

*Primary Examiner* — Matthew Martin
(74) *Attorney, Agent, or Firm* — Fox Rothschild LLP

(57) ABSTRACT

A substrate-supported photoelectrode, which includes an essentially two-dimensional transparent conductive oxide (TCO) film supported by a substrate, wherein the film is doped with at least one element of Group III, and one or more single crystal essentially one-dimensional nanostructures that are integral with the film and grown upwardly therefrom without a boundary layer therebetween, wherein the film and the nanostructures are essentially identical in composition and include zinc oxide or a zinc oxide alloy. Methods for preparing the substrate-supported photoelectrode and solar cells incorporating the substrate-supported photoelectrode are also provided.

14 Claims, 7 Drawing Sheets

(56) References Cited

U.S. PATENT DOCUMENTS

| | | | |
|---|---|---|---|
| 2005/0139257 A1* | 6/2005 | Islam et al. | 136/263 |
| 2006/0070653 A1* | 4/2006 | Elrod et al. | 136/263 |
| 2006/0137740 A1* | 6/2006 | Park et al. | 136/263 |

OTHER PUBLICATIONS

Yuhas et al., "Transition Metal Doped Zinc Oxide Nanowires", Angewandte Chemie, published 2005.*

Minemoto et al., "Preparation of MgZnO films by radio frequency magnetron sputtering", Thin Solid Films, 2000.*

Sobajima, Y. et al., "Study of the light-trapping effects of textured ZnO:Al/glass structure TCO for improving photocurrent of a-Si:H solar cells," J. Materials Science: Materials in Electronics, (vol. 18) pp. 5159-5162, (Mar. 20, 2007).

Berginski, Michael et al., "The effect of front ZnO:Al surface texture and optical transparency on efficient light trapping in silicon thin-film solar cells," J. Appl. Phy., (vol. 101), (pp. 074903-1-074903-11), (Apr. 9, 2007).

Selvan, J. A. et al., "A new light trapping TCO for nc-Si:H solar cells," Solar Energy Materials & Solar Cells, (vol. 90), (pp. 3371-3376), (Aug. 2, 2006).

Campa, A. et al., "The potential of textured front ZnO and flat TCO/metal back contact to improve optical absorption in thin Cu(In,Ga)Se2 solar cells," Thin Sold Films, (vol. 515), (pp. 5968-5972) (Jan. 11, 2007).

Sang, Baosheng et al., "MOCVD-ZnO windows for 30 cm × 30 cm CIGS-based modules," Solar Energy Materials & Solar Cells, (vol. 75), (pp. 179-184), (2003).

Sang, Baosheng et al., "Performance improvement of CIGS-based modules by depositing high-quality Ga-doped ZnO windows with magnetron sputtering," Solar Energy Materials & Solar Cells, (vol. 67), (pp. 237-245), (2001).

Law, M. et al., "Nanowire-based dye-sensitized solar cells," Nature Materials, (vol. 4), (p. 455-59), (2005).

Sun, Q. et al., "Synthesis and Characterization of Polystyrene-Encapsulated Laponite Composites via Miniemulsion Polymerization," Macromol. Mater. Eng. vol. 289, pp. 288-295, (2004).

Wu, Y. et al., "Inorganic Semiconductor Nanowires: Rational Growth, Assembly, and Novel Properties," Chem.-Eurp. J., (vol. 8), (p. 1260-68), (2002).

Wang, R. C. et al., "ZnO hexagonal arrays of nanowires grown on nanorods," Applied Phys. Lett. 86, p. 251104-1-251104-3, (Jun. 15, 2005).

Park, W. J. et al., "Excitonic emissions observed in ZnO single crystal nanorods," Appl. Phys. Lett., p. 964-66, (Feb. 10, 2003).

Chen, H. et al., "Interface Properties of ZnO Nanotips Grown on Si Substrates," Journal of Electronic Materials, vol. 35 (No. 6), pp. 1241-1245, (2006).

Chen, Hanhong et al., "Properties of ZnO Nanotips Selectively Grown by MOCVD," Proceedings of SPIE, pp. 164-169, (2004).

Zhong, J. et al., "Integrated ZnO nanotips on GaN light emitting diodes for enhanced emission efficiency," Applied Physics Letters, vol. 90, pp. 203515-1-203515-3, (May 18, 2007).

Li, Y. et al., "Transparent and conductive Ga-doped ZnO films grown by low pressure metal organic chemical vapor deposition," J. Vac. Sci. Technology A, vol. 15 (No. 3), pp. 1063-1068, May/Jun. 1997.

Zhong, J. et al., "Ga-doped ZnO single-crystal nanotips grown on fused silica by metalorganic chemical vapor deposition," Applied Physics Letters, vol. 83 (No. 16), pp. 3401-3403, (Oct. 20, 2003).

Galoppini, Elena et al., "Fast Electron Transport in Metal Organic Vapor Deposition Grown Dye-sensitized ZnO Nanorod Solar Cells," Journal of Physical Chemistry B Letters, vol. 110, No. 33, pp. 16159-16161, (Aug. 1, 2006).

Du Pasquier, Aurelien et al., "Dye sensitized solar cells using well-aligned zinc oxide nanotip arrays," Applied Physics Letters, vol. 89, pp. 253513-1-253513-3, (Dec. 22, 2006).

Baxter, Jason B. et al., "Nanowire-based dye-sensitized solar cells," Applied Physics Letters, p. 053114-1-3, (Jan. 28, 2005).

Olson, Dana C. et al., "Hybrid photovoltaic devices of polymer and ZnO nanofiber composites," Thin Solid Films, vol. 496, pp. 26-29, (Sep. 15, 2005).

Guo, L. et al., Regularly Shaped Single-Crystalline ZnO Nanorods with Wurtzite Structure,: J. Am. Chem. Soc., vol. 124, p. 14864-65, (2002).

Ibrahim, A. A. et al., "ZnO/Si solar cell fabricated by spray pyrolysis technique," J. Mater Sci: Mater Electron, vol. 17, pp. 835-839, (2006).

Wang et al., Zinc oxide nanostructures: growth, properties and applications, J. Phys., Consens Matter, vol. 16, pp. 830-858, (Jun. 11, 2004).

\* cited by examiner

ZINC OXIDE PHOTOELECTRODES AND METHODS OF FABRICATION

CROSS REFERENCE TO RELATED APPLICATIONS

This application claims priority to U.S. Provisional Application Ser. No. 60/876,400, which was filed on Dec. 21, 2006, the disclosure of which is incorporated herein by reference.

BACKGROUND OF THE INVENTION

Soaring energy price and global warming have stimulated growing research interest in new energy technologies. Solar cells could provide clean and renewable energy that can reduce the world's dependence on fossil fuel. Currently, the dominant solar cell technology is based on solid-state semiconductor materials, including polycrystalline silicon, amorphous silicon, cadmium telluride (CdTe), and copper indium gallium diselenide $Cu(In, Ga)Se_2$. These types of solar cells have high power conversion efficiency; however, suffer from high manufacture cost. Dye sensitized solar cells and polymer/inorganic semiconductor hybrid solar cells are promising alternatives as they offer advantages of low cost, simple processing and potential large-scale production.

In these devices, the photoexcitation takes places in the dye (polymer) molecules and photogenerated charges are separated at the dye/oxide (polymer/oxide) interface. As the light-harvesting dye (polymer) molecules are present as a thin layer, the surface area of the semiconductor oxide must be substantial in order to achieve efficient light absorption. The electron transport in the semiconductor oxide is dominated by diffusion; therefore, it is necessary to reduce the charge traps in the semiconductor oxides for fast electron transport. In these solar cells, a transparent conducting oxide (TCO) serves as an optical window, which determines the amount of light entering the device, and as the electrode, which extracts photocurrent. The reduction of TCO cost is very important for the commercialization of these solar cells.

SUMMARY OF THE INVENTION

The present invention is directed to a substrate-supported photoelectrode, which includes an essentially two-dimensional transparent conductive oxide (TCO) film supported by a substrate, wherein the film is doped with at least one element of Group III, and one or more single crystal essentially one-dimensional nanostructures that are integral with the film and grown upwardly therefrom without a boundary layer therebetween, wherein the film and the nanostructures are essentially identical in composition and include zinc oxide or a zinc oxide alloy.

A solar cell, which includes the substrate-supported photoelectrode, is also provided.

Also presented is a method for preparing the substrate-supported photoelectrode of the present invention by (a) introducing the substrate into a metalorganic chemical vapor deposition (MOCVD) reactor; (b) exposing the substrate to an oxidant, a gas-phase zinc compound that oxidizes to form zinc oxide or a zinc oxide alloy, and a compound, which includes an element of Group III in an amount effective to dope the zinc oxide or zinc oxide alloy with the Group III element, while simultaneously heating the substrate to a first temperature effective to form the two-dimensional film on at least a portion of the substrate; and (c) heating the substrate of step (b) to a second temperature greater than the first temperature that is effective to form the one-dimensional nanostructures.

DETAILED DESCRIPTION OF THE INVENTION

Figure 1:
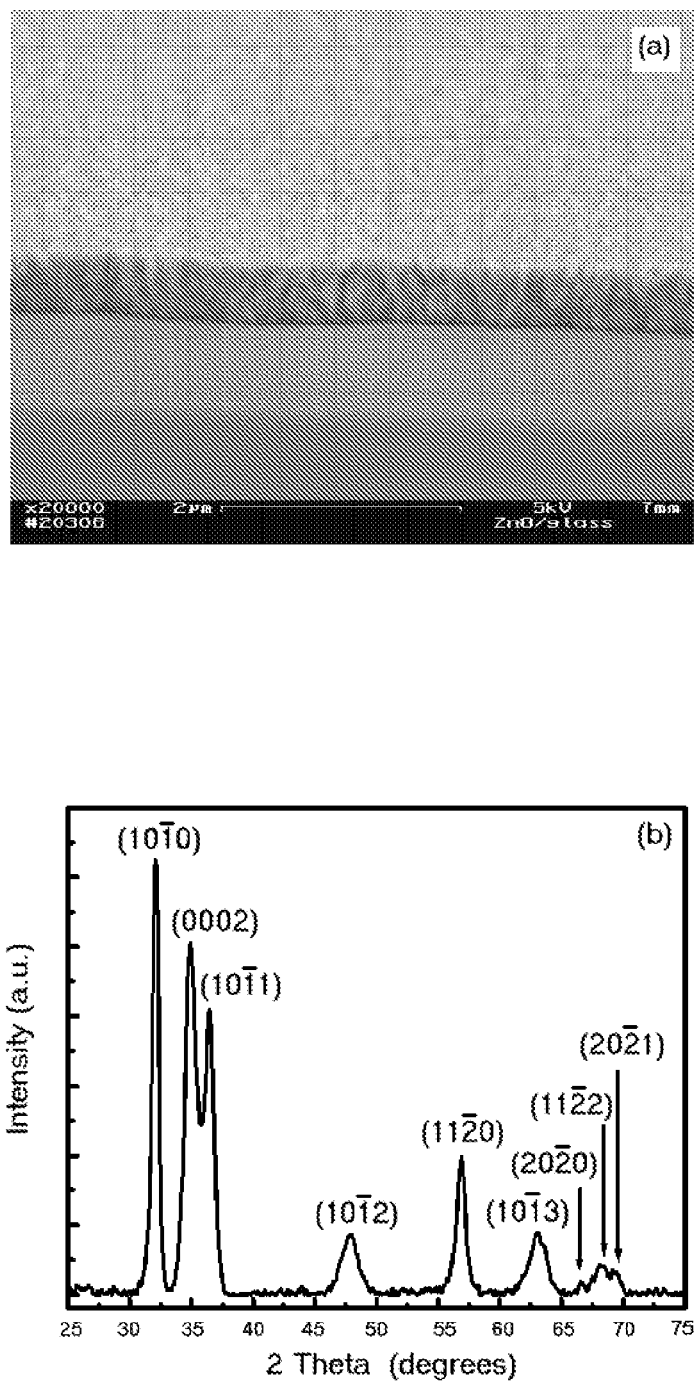
FIG. 1(a) is a field emission scanning electron microscope (FESEM) image of a Ga-doped ZnO film; (b) is an X-ray diffraction (XRD) spectrum of a Ga-doped ZnO film.

The present invention relates to a substrate-supported photoelectrode, which includes an essentially two-dimensional transparent conductive oxide (TCO) film supported by a substrate, wherein the film is doped with at least one element of Group III, and one or more single crystal essentially one-dimensional nanostructures that are integral with the film and grown upwardly therefrom without a boundary layer therebetween, wherein the film and the nanostructures are essentially identical in composition and include zinc oxide or a zinc oxide alloy. A preferred zinc oxide alloy is $Mg_xZn_{1-x}O$, wherein 0<x<1.

In the photoelectrode, the film defines a two-dimensional XY-plane of minimal thickness dimension in the Z-direction. The nanostructures of minimal XY-dimension are grown upward therefrom in the Z-direction.

Preferred Group III dopants include aluminum (Al), indium (In), gallium (Ga), and boron (B). Preferred dopant precursors include, but are not limited to, trichloride dimethyloctylamine complex ($BCl_3(CH_3)_2NC_8H_{17}$), triethyl boron ($B(C_2H_5)_3$), trimethylgallium (TMGa), triethylgallium (TEGa), trimethylaluminium (Al(CH$_3$)$_3$), dimethylethylamine alane (AlH$_3$N(CH$_3$)$_2$(C$_2$H$_5$)), dimethylaluminium hydride ((CH$_3$)$_2$AlH), diethylaluminium ethoxide ((C$_2$H$_5$)$_2$Al(OC$_2$H$_5$)), trimethylindium (In(CH$_3$)$_3$). In one embodiment, the film includes ZnO doped with at least one element of Group III. Preferably, the film is doped in an amount less than about 75 atomic percent (at. %). As used herein, the phrase "atomic percent" is defined as x·100, wherein the film includes the composition Zn$_{1-x}$M$_x$O$_2$, wherein M is the dopant and 0<x<1. More preferred dopant levels are: gallium (0.005<x<0.12), aluminum (0<x<0.1), boron (0.002<x<0.1), and indium (0.45<x<0.75).

The film and the nanostructures are essentially identical in composition. For example, in one embodiment, the film is ZnO doped with at least one Group III element, while the nanostructures are ZnO, which may or may not be doped with at least one Group III element. In one embodiment, the nanostructures include ZnO doped with In or Ga.

Preferably, the one or more nanostructures are selected from nanowires, nanorods, nanotips, and combinations thereof. In one embodiment, the nanostructures include single crystalline undoped or doped ZnO and are aligned in a direction normal to the substrate. Nanostructures aligned this way provide the photoelectrode with trenches between the nanostructures into which chemical compositions such as polymer gel electrolytes or solid-state hole conductors can be deposited. Additionally, single crystalline nanostructures of the present invention also have a low defect density. Direct conduction pathways and the absence of charge traps provide faster electron transport in the photoelectrode of the present invention in comparison with known nanoparticle films.

Preferably, the length of the nanostructures in the Z-direction ranges from about 10 nm to about 20 μm, and the diameter of the nanostructures in the XY-dimension ranges from about 5 nm to about 80 nm.

The substrate can be any substrate suitable for supporting a transparent conductive oxide film. In one embodiment, the substrate is rigid or flexible. Preferred substrates include, but are not limited to, glass, gold, aluminum, steel, silicon wafers, SiO$_2$, and polyimide.

The nanostructures provide a large surface area for bonding additional molecules. Therefore, in an additional embodiment, one or more dye and/or polymer molecules are bonded to the nanostructures. The essentially one-dimensional feature of the nanostructures provides a direct charge transport pathway in comparison with known nanoparticle films where the charge transport through the trap-detrap mechanism is slow. The single crystal quality of such one-dimensional nanostructures also improves energy conversion efficiency. Suitable dyes and polymers include those that enhance light absorption by the photoelectrode. Preferred dyes include, but are not limited to, Ru-based, Fe-based, and phthalocyanine-based dyes. Preferred polymer molecules include, but are not limited to, poly(alkyl)thiophene, polyparaphenylene vinylene, polyvinyldifluoride, and copolymers thereof.

Also provided is a solar cell, which includes the substrate-supported photoelectrode of the present invention. A typical solar cell, which can be dye-sensitized, includes a transparent conducting oxide (TCO) film, a nanostructured semiconductor oxide layer, liquid redox electrolyte, and a counter-electrode. The photoelectrode of the present invention provides a TCO film and nanostructures that are integral without a boundary layer therebetween. The photoelectrode provides a UV-harvesting effect to enhance the power efficiency of the solar cell. Additionally, strong UV-absorption by the photoelectrode improves the reliability and lifetime of the solar cell by protecting it from UV degradation.

Preferred solar cells include, but are not limited to, dye-sensitized solar cells, polymer solar cells, silicon solar cells, copper indium gallium selenide (CIGS) solar cells, bulk-heterojunction solar cells, and hybrid inorganic-organic solar cells. Optionally, the solar cell also includes a polymer gel electrolyte, an ionic liquid, a conjugated polymer, ZnO or TiO$_2$ nanoparticles, conjugated polymers mixed with electron acceptor nanoparticles, or a combination thereof. In one embodiment, the photoelectrode is a transparent conducting and light trapping window in the solar cell.

Also presented is a method for preparing the substrate-supported photoelectrode of the present invention by (a) introducing the substrate into a metalorganic chemical vapor deposition (MOCVD) reactor; (b) exposing the substrate to an oxidant, a gas-phase zinc compound that oxidizes to form zinc oxide or a zinc oxide alloy, and a dopant compound, which includes an element of Group III in an amount effective to dope the zinc oxide or zinc oxide alloy with the Group III element, while simultaneously heating the substrate to a first temperature effective to form the two-dimensional film on at least a portion of the substrate; and (c) heating the substrate of step (b) to a second temperature greater than the first temperature that is effective to form the one-dimensional nanostructures.

Preferred zinc compounds include, but are not limited to, diethyl zinc, zinc acetate, zinc alkoxide, zinc acetyl-acetonate, methylzinc isopropanolato [CH$_{(3)}$ZnOPri], and zinc bis(2-thenoyl-trifluoroacetonate). Preferred magnesium precursor compounds suitable for preparing the zinc oxide alloy Mg$_x$Zn$_{1-x}$O, wherein 0<x<1, include, but are not limited to, bis(5-cyclopentadienyl)magnesium, (Mg(C$_5$H$_5$)$_2$), bis(5-cyclopentadienyl)magnesium (Mg(C$_5$H$_5$)$_2$ in C$_{30}$H$_{62}$), and bis (methyl-5-cyclopentadienyl)magnesium (Mg(CH$_3$C$_5$H$_4$)). Preferably, the magnesium precursor compound is mixed with the zinc compound prior to introduction into the MOCVD reactor.

Doping level can be controlled by adjusting the flow rate of the dopant compound. Preferably, the dopant compound is mixed with the zinc compound prior to introduction into the MOCVD reactor.

The first and second temperatures can be any temperature suitable for forming the transparent conductive oxide layer of the present invention. Preferably, the first temperature is between about 250° C. and about 400° C. and the second temperature is between about 400° C. and about 500° C.

Also provided is a method for increasing the length of the nanostructures of the photoelectrode by contacting the nanostructures with a zinc ion source in an amount effective to increase the length of the nanostructures. Soluble zinc ion sources are preferred. The length of the nanostructures can be controlled by the amount of time the nanostructures are in contact with the zinc ion source.

The following non-limiting examples set forth herein below illustrate certain aspects of the invention.

EXAMPLES

Example 1

ZnO Nanotips/Ga-doped ZnO Films

The growth of ZnO nanotips and Ga-doped ZnO (GZO) films was carried out in a vertical flow, and rotating disk metalorganic chemical vapor deposition (MOCVD) reactor. Diethylzinc (DEZn) and oxygen were used as the zinc precursor and oxidizer, respectively. Triethylgallium (TEGa) was used as the gallium doping source. FIG. 1(a) shows a SEM image of GZO film grown on a glass substrate. The GZO film has a dense structure and a relatively smooth surface. The XRD spectrum of the GZO film is shown in FIG. 1(a). Besides the peaks from ZnO (0002) and ZnO (0004), peaks from other low-index ZnO crystalline planes, such as ZnO (10$\bar{1}$0) and ZnO (10$\bar{1}$1), are also present, indicating that the GZO film has a polycrystalline structure.

The growth rates of ZnO crystal in different crystalline directions follow the order: [0001]>[01$\bar{1}$0]>[01$\bar{1}$1]>[000$\bar{1}$]. As-grown ZnO usually exhibits a columnar structure due to the fastest growth rate along the ZnO [0001] direction. For the GZO films used as the transparent electrode, the formation of columnar structure is undesirable, as it would block the lateral current spreading. The temperature plays a significant role in determining the morphology of GZO films. At high temperature, the ZnO growth has the thermodynamic tendency to form crystal with equilibrium shapes. As the ZnO (0002) plane has the lowest surface energy, the growth of ZnO (0002) crystalline plane is uninterrupted and forms a c-axis oriented columnar films. At low growth temperature, however, the zinc precursor and oxygen have lower kinetic energies and the growth of GZO films is controlled by the surface kinetics. The expansion of the crystallites is slow; particularly the elongation along the ZnO c-axis direction is suppressed. As a result, the GZO films grown at low temperature form a dense polycrystalline structure. In order to obtain a dense GZO film structure, the growth temperature was kept below 400° C.

Figure 2:
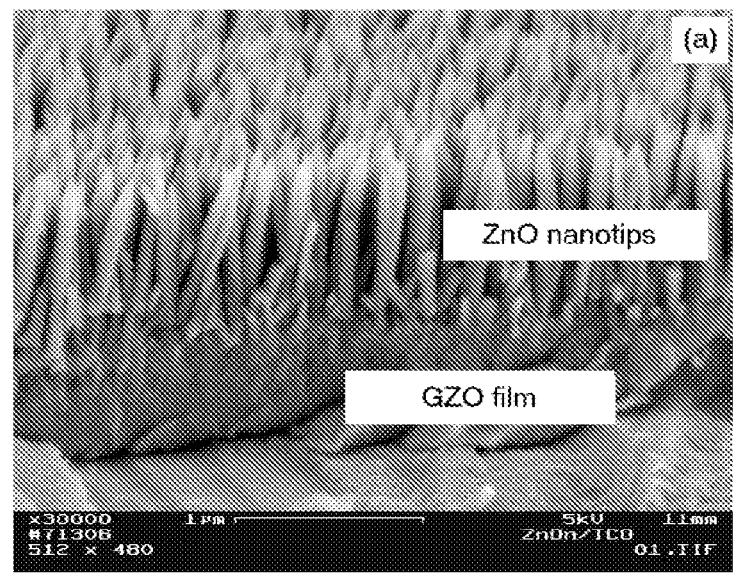
FIG. 2(a) is a field emission scanning electron microscope (FESEM) image of ZnO nanotips grown on Ga-doped ZnO film; (b) is an X-ray diffraction (XRD) spectrum of ZnO nanotips grown on accompanying glass substrate.
Figure 2:
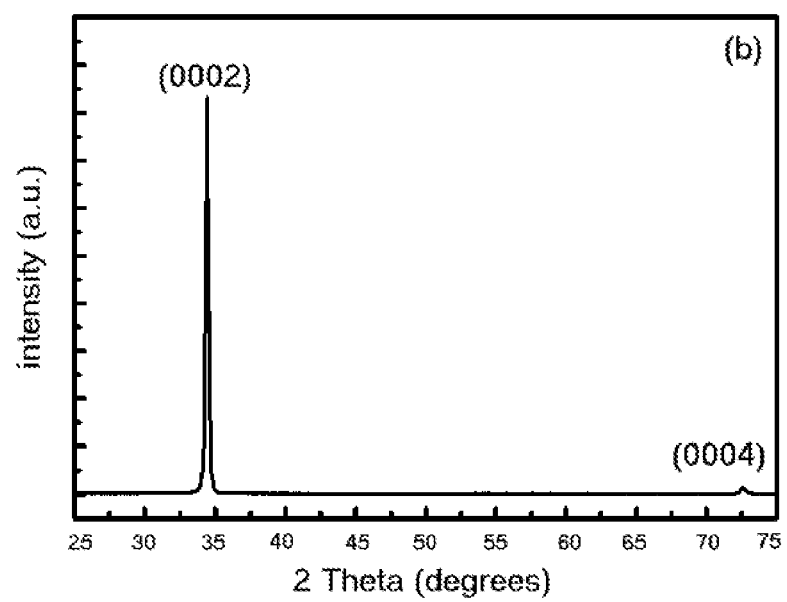

To grow ZnO nanotips on the GZO films, the growth temperature was increased to ~470° C. FIG. 2(a) shows a FESEM image of ZnO nanotips grown on a GZO film. ZnO nanotips are vertically aligned along the substrate normal direction. The ZnO grown on the GZO films have the same morphology as those directly grown on glass substrates under the same growth conditions. FIG. 2(b) shows the XRD spectrum of the ZnO nanotips grown on the accompanying glass substrate. Only peaks from ZnO (0002) and ZnO (0004) are observed, indicating that ZnO nanotips are c-axis oriented. The ZnO nanotips grown on the GZO films also have c-axis orientation. Transmission electron microscope (TEM) characterization reveals that a ZnO nanotip has single crystalline quality with very low defect concentration. The formation of the vertically aligned ZnO nanotip array is attributed to a spatial blocking effect in conjunction with the fastest growth rate along ZnO [0001] direction. The nucleation of ZnO at the initial growth stage is a random process. Due to the highest growth rate of ZnO (0002) plane, those ZnO nuclei quickly elongate along the c-axis direction and only those ZnO nuclei with c-axis direction parallel to the substrate surface normal have chances to grow due to limited in-plane space. As a result, ZnO forms an aligned nanotip array at the early growth stage. In the subsequent growth, the Zn precursor and oxygen continue impinging on the nanotip ends, but have difficulties reaching into the narrow gaps between ZnO nanotips. As a result, the length of ZnO nanotips increases quickly, while the diameter of the ZnO nanotips barely changes with the time.

Figure 3:
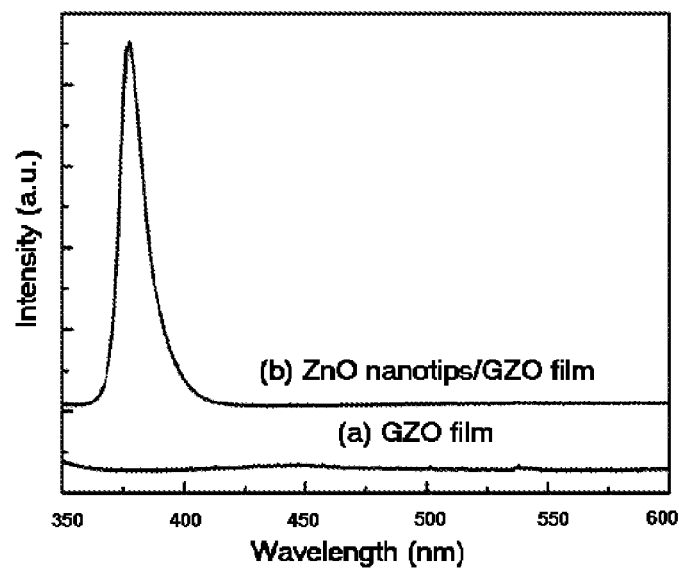
FIGS. 3(a) and (b) are room temperature photoluminescence (PL) spectra of (a) a GZO film and (b) ZnO nanotips grown on a GZO film.

Shown in FIG. 3 are the room temperature PL spectra of GZO film and ZnO nanotips/GZO film. The near band edge (NBE) emission of GZO films is significantly quenched due to the heavy Ga doping (Curve a). The peak at 376 nm (3.30 eV) from the ZnO nanotips/GZO film structure is predominantly from the free exciton emissions of ZnO nanotips (Curve b). Due to the larger exciton binding energy of 60 meV, free excitons in high quality MOCVD-grown ZnO nanotips or nanorods can survive up to room temperature. The strong peak intensity in PL indicates good optical property of ZnO nanotips.

Figure 4:
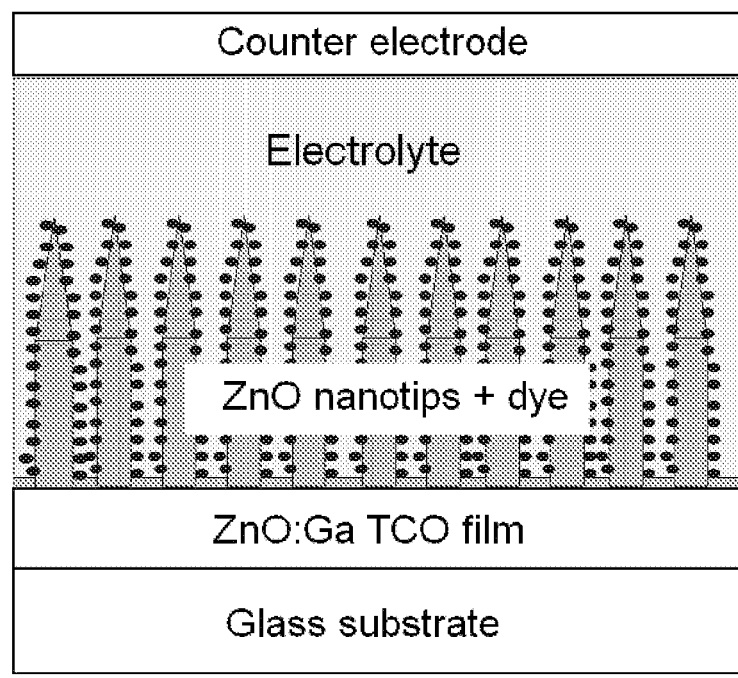
FIG. 4 is a schematic illustration of a dye sensitized solar cell using a well-aligned ZnO nanotip array and Ga-doped ZnO TCO film as the photoactive electrode.

FIG. 4 shows the DSSC structure using ZnO nanotips and GZO film. The photoactive electrode consists of a layer of GZO film (~400 nm) and an array of ZnO nanotips (several μm), which are vertically aligned along the substrate surface normal. The GZO film and ZnO nanotips were sequentially grown on glass substrates using temperature modulated MOCVD growth. To fabricate the solar cells, ZnO nanotips were sensitized by immersing in a 0.3 mM ruthenium polypyridine dye (RuN3, Dyesol) ethanolic solution. A 25 Mm microporous polyelofin battery separator (Celgard) soaked with 0.5 M LiI, 0.05 M $I_2$, 0.5 M tert-Butyl pyridine in methoxypropionitrile electrolyte was placed on the ZnO nanotip array. A platinum foil was clamped with a glass slide on the separator as the counter electrode. The solar cell area was calculated to be 10 mm×10 mm.

Figure 5:
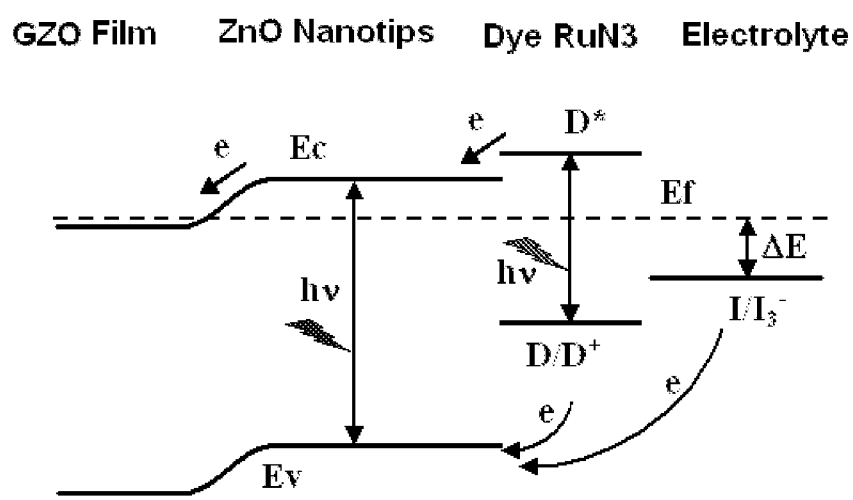
FIG. 5 is a schematic illustration of the energy band diagram of ZnO nanotip/GZO-based dye sensitized solar cells.

The energy band diagram of ZnO nanotip/GZO-based dye sensitized solar cell is shown in FIG. 5. Since the light is incident from the backside of TCO electrode, UV photons with energy higher than the band gap energy of ZnO (3.30 eV) are absorbed by the ZnO photoelectrode and raise electrons from the valence band to conduction band of ZnO. The photogenerated electrons diffuse through the ZnO nanotip array to TCO electrode, leaving the holes in ZnO valence band. The holes in ZnO valence band are replenished with electrons donated from ions in the electrolyte. The photons with energy lower than the band gap energy of ZnO are harvested by the dye molecules, which are anchored at the surface of ZnO. The photogenerated charges are separated at the dye/ZnO interface. The oxidized dye molecules are reduced by the electrons donated from the ions in the liquid electrolyte.

Figure 6:
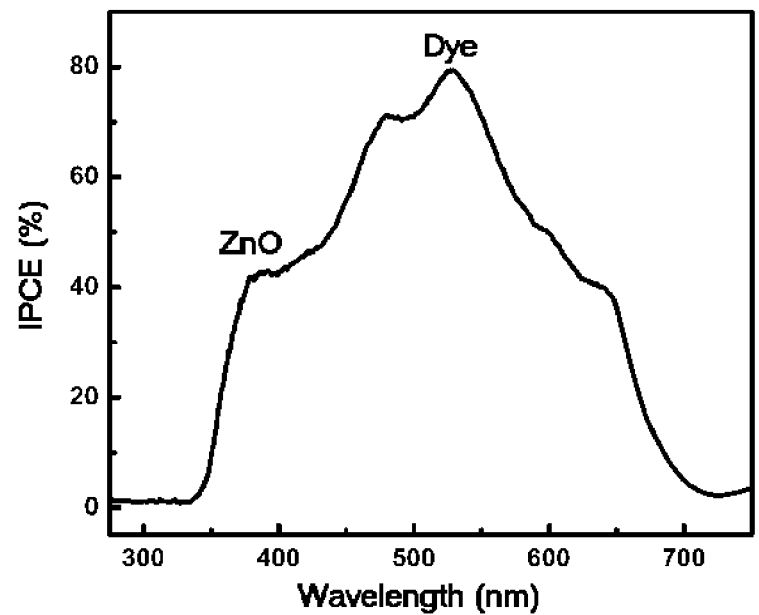
FIG. 6 is an incident photon-to-current conversion efficiency (IPCE) spectrum of ZnO nanotips/GZO sensitized solar cell built from 4.8 µm ZnO nanotips.

Shown in FIG. 6 is an incident photo-to-current conversion efficiency (IPCE) spectrum of the cells with 4.8 μm long ZnO nanotips. The IPCE induced by dye has the maximum value of 79% at 530 nm, which is comparable to the cells built from TiO2 nanoparticles. The high IPCE value is promising for high efficient DSSCs. Another peak is observed at 378 nm with an IPCE value of 42%, which is attributed to the direct UV light harvesting in the ZnO. The UV light harvesting can be exploited to improve the stability of the DSSC by preventing dye molecules degradation under UV irradiation.

Figure 7:
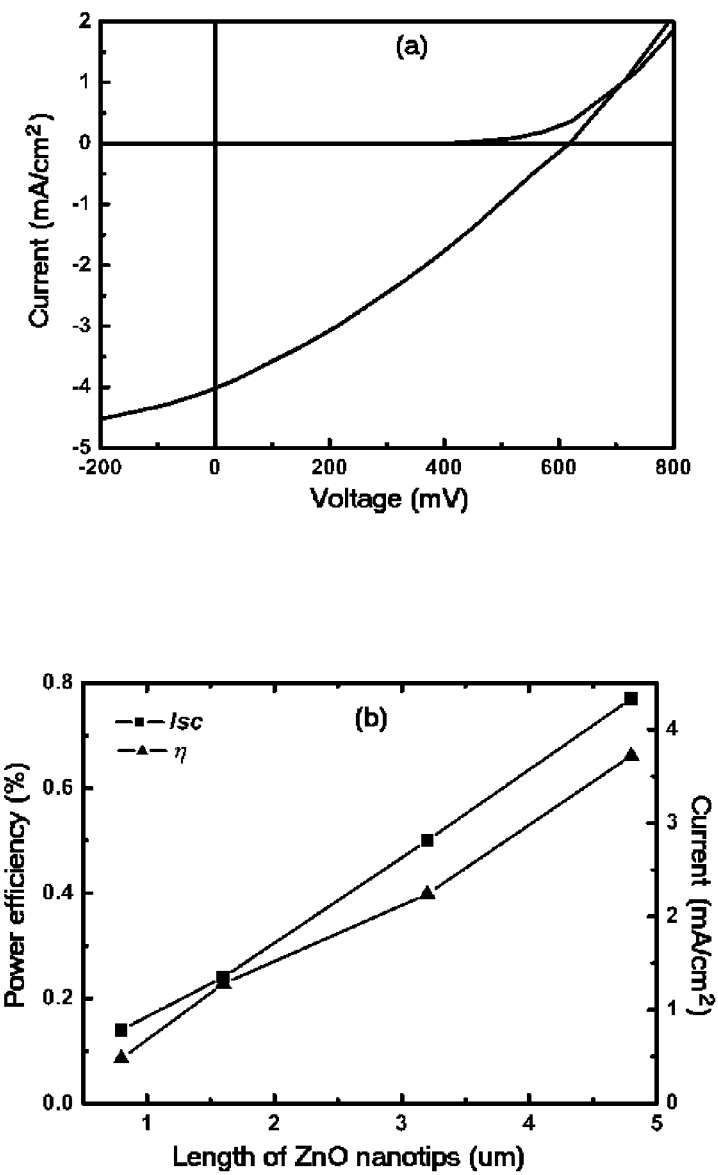
FIG. 7 is (a) I-V characteristics of a dye sensitized solar cell built from 4.8 µm ZnO nanotips (the tests are conducted in dark and under the illumination of one sun simulated light); and (b) the short circuit current ($I_{sc}$) and power conversion efficiency (η) as a function of ZnO nanotips length used in DSSCs.

The photoresponse of GZO—ZnO nanotip-sensitized cells was measured under the illumination of 100 mW/cm$^2$ AM 1.5G simulated sunlight. FIG. 7(a) shows the photoresponse of the cells (area: ~1.0 cm$^2$.) built from 4.8 μm ZnO nanotips. The short circuit current and the open circuit voltage are measured to be 4.1 mA/cm$^2$ and 628 mV, respectively. The short circuit current linearly increases with the increase of ZnO nanotip length as shown in FIG. 7(b). The short circuit current of the cells built from 0.8, 1.6, 3.2, and 4.8 μm ZnO nanotips are 1.0, 1.7, 2.8, and 4.1 mA/cm$^2$, respectively. The power efficiency was calculated to be 0.14%, 0.24%, 0.5% and 0.77% for 0.8, 1.6, 3.2 and 4.8 μm ZnO nanotips, respectively. The linear increase of power efficiency with the length of ZnO nanotips indicates that the dye loading is the main limiting factor, and further improvement in power efficiency could be achieved by increasing the length of ZnO nanotips.

Example 2

ZnO Nanotips/GZO Dye Sensitized Solar Cells Using Gel Electrolyte

Dye sensitized solar cells (DSSC) were built with 3.2 μm ZnO nanotip arrays grown on GZO films. Gel electrolytes containing liquid electrolyte and gelator were first injected into photoelectrode. Impregnation of the DSSC was achieved by heating the cells at temperature of ~80° C. NMP is an ideal solvent for PVDF-HFP copolymers and PVDF homopolymers as the stable gel can be formed by their mixtures. Gel electrolyte provides high device stability compared with liquid electrolyte. However, the fill-in process in nanoparticle-sensitized solar cells presents a challenge as the gel electrolyte usually has higher viscosity than the liquid electrolyte. Lower power conversion efficiency in $TiO_2$ nanoparticle sensitized solar cells is observed when using the gel electrolyte. Compared with nanoparticle films, MOCVD-grown ZnO nanotips are well aligned along the substrate surface normal; therefore, form straight "trenches" from the top to the base of the ZnO nanotip array. The diameters of the "trenches" between the neighboring nanotips are in the range of 5~10 nm, which is larger than the porous size of typical nanoparticle film. Therefore, the gel electrolyte can easily penetrate into the ZnO nanotips array and efficiently contact with the dye sensitized ZnO surface.

Figure 8:
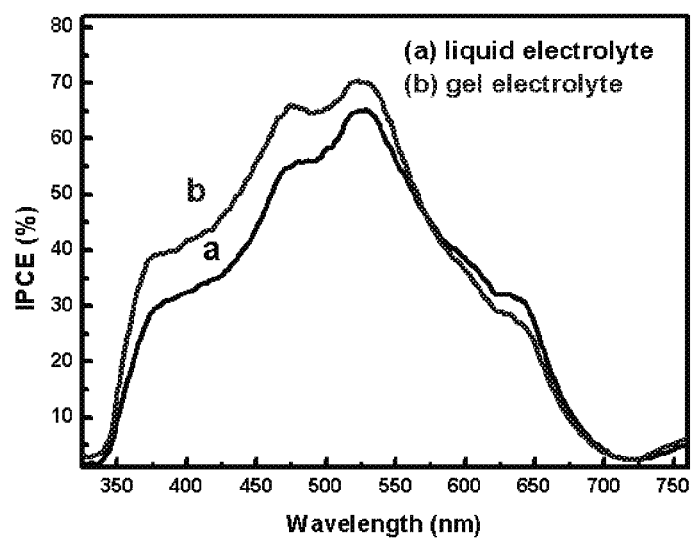
FIG. 8 is incident photo-to-electric conversion efficiency (IPCE) spectra of 3.2 µm ZnO nanotip-based dye sensitized solar cells using NMP gel and liquid electrolyte.

FIG. 8 compares the incident photo-to-current conversion efficiency (IPCE) spectra of DSSC using NMP-based gel electrolyte and liquid electrolyte built from the same ZnO nanotips under the same impregnation conditions. The peak IPCE values (at ~530 nm) for the gel and liquid electrolyte are 70% and 65%, respectively. The higher IPCE value in gel electrolyte indicates that the backward electron transfer from ZnO conduction band to the electrolyte is lower than that using liquid electrolyte. The higher internal quantum efficiency in semi-solid gel electrolyte based DSSC is achieved.

Figure 9:
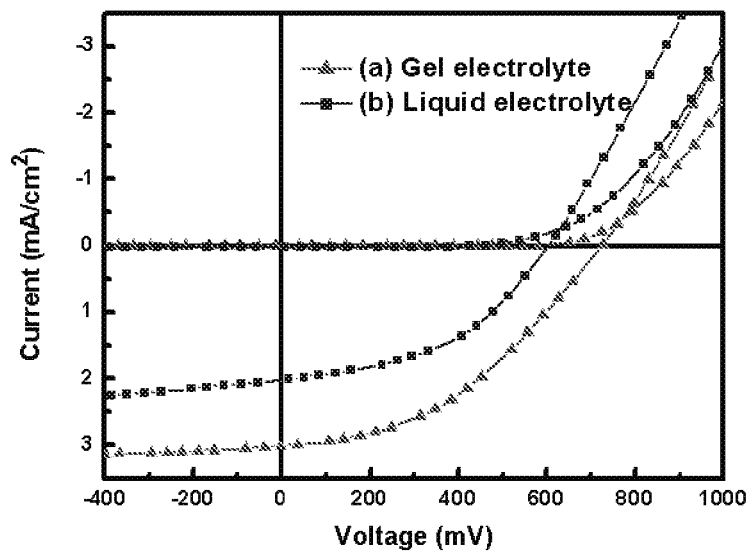
FIG. 9 provides the I-V characteristics of DSSCs built from 3.2 µm ZnO nanotips impregnated with both MPN-based liquid electrolyte and NMP-based gel electrolyte (the photoresponse is measured under the illumination of Xe AM 1.5G simulated sunlight (100 mW/cm$^2$) with a 1.0 cm$^2$ cell area)

FIG. 9 compares the photoresponse of DSSCs built from 3.2 μm ZnO nanotips impregnated with NMP-based liquid electrolyte and NMP-based gel electrolyte. The short circuit current is 1.9 mA/cm$^2$ and 2.9 mA/cm$^2$ for liquid and gel electrolyte, respectively. The open circuit voltage, $V_{oc}$ using gel electrolyte is ~726 mV in comparison to ~610 mV for the liquid electrolyte counterpart. An improvement in fill factor is also observed with the NMP gel electrolyte, which leads to higher overall power conversion efficiency. The increase in fill factor is also reflected in the higher parallel resistance of the cells using NMP gel electrolyte. The cells using liquid electrolyte exhibit a power efficiency of 0.77%, and higher power conversion efficiency of 0.89% is achieved when the NMP electrolyte is gelled with 20 wt. % PVDF-HFP (at 100 mW/cm$^2$).

Example 3

P3HT-PCBM Polymer Solar Cells Using ZnO Nanotips/GZO Structure

Figure 10:
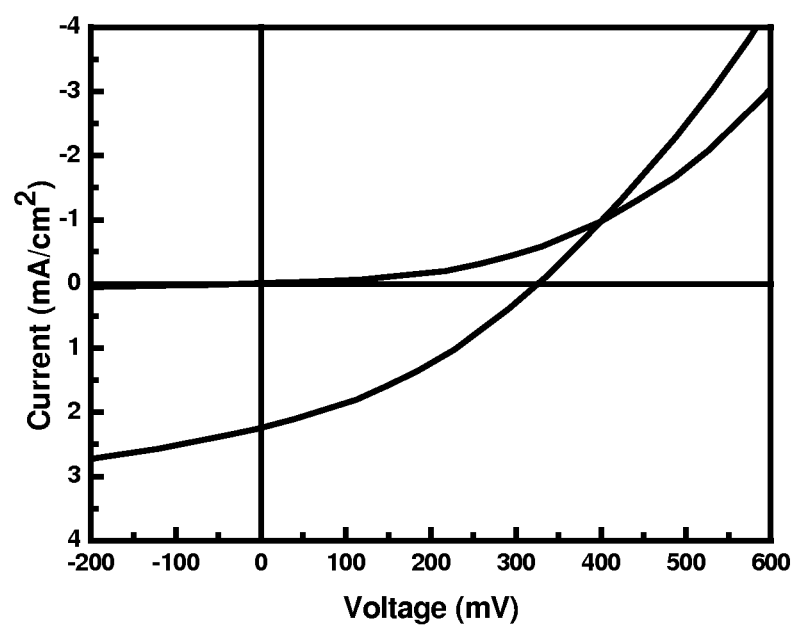
FIG. 10 illustrates I-V characteristics of Ag/P3HT+PCBM/ZnO nanotips/GZO hybrid solar cells (The length of ZnO nanotips is ~100 nm. The photoresponse is measured under the illumination of Xe AM 1.5G simulated sunlight (100 mW/cm$^2$) with a 1.0 cm$^2$ cell area).

The polymer/inorganic semiconductor hybrid solar cells were built by spin coating P3HT+PCBM (1:1, 10 g/L in chloroform ~1500 rpm) onto the ZnO nanotips/GZO structure. A 100 nm Ag was deposited by the e-beam evaporation as the top hole collector electrode. FIG. 10 shows the photoresponse of the solar cell with the Ag/P3HT+PCBM/ZnOnanotips/GZO structure. The short circuit current is 2.23 mA/cm$^2$ and the open circuit voltage is measured to be ~330 mV.

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and script of the invention, and all such variations are intended to be included within the scope of the following claims.

What is claimed is:

1. A substrate-supported three-dimensional (3-D) photoelectrode comprising:
an essentially two-dimensional (2-D) transparent zinc oxide electrode film disposed directly on a non-conductive substrate without a boundary layer therebetween, wherein said 2-D film is doped with at least one element selected from the group consisting of Al, Ga, and B; and
an array of single crystal essentially one-dimensional (1-D) nanostructures that are integral with said 2-D film and extend upwardly therefrom without a boundary layer therebetween, wherein said one or more 1-D nanostructures are not in direct contact with the substrate and are aligned normal to said 2-D film, wherein said nanostructures comprise a zinc oxide based alloy.

2. The substrate-supported photoelectrode of claim 1, wherein the one or more nanostructures are selected from the group consisting of nanowires, nanorods nanotips, and combinations thereof.

3. The substrate-supported photoelectrode of claim 1, wherein one or more dye and/or polymer molecules are bonded to the nanostructures.

4. The substrate-supported photoelectrode of claim 3, wherein the dye is selected from the group consisting of Ru-based, Fe-based, and phthalocyanine-based dyes.

5. The substrate-supported photoelectrode of claim 3, wherein the polymer molecule is selected from the group consisting of poly(alkyl)thiophene, polyparaphenylene vinylene, polyvinyldifluoride, and copolymers thereof.

6. A solar cell comprising the substrate-supported photoelectrode of claim 1.

7. The solar cell of claim 6, wherein the solar cell is selected from the group consisting of dye-sensitized solar cells, polymer solar cells, silicon solar cells, copper indium gallium selenide (CIGS) solar cells, bulk-heterojunction solar cells, and hybrid inorganic-organic solar cells.

8. The solar cell of claim 6, wherein the solar cell further comprises a polymer gel electrolyte, an ionic liquid, a conjugated polymer, ZnO or $TiO_2$ nanoparticles, conjugated polymers mixed with electron acceptor nanoparticles, or a combination thereof.

9. The solar cell of claim 6, wherein the photoelectrode is a transparent conducting and light trapping window in the solar cell.

10. The substrate-supported photoelectrode of claim 1, wherein the zinc oxide alloy is $Mg_xZn_{1-x}O$, wherein $0<x<1$.

11. The substrate-supported photoelectrode of claim 1, wherein said single crystal essentially one-dimensional nanostructures have a diameter that ranges between about 5 and about 20 nm.

12. The substrate-supported photoelectrode of claim 11, wherein said single crystal essentially one-dimensional nanostructures have a length of about 3.2 microns.

13. The substrate-supported photoelectrode of claim 1, wherein the 2-D film is doped with gallium.

14. A solar cell comprising:
a polymer gel electrolyte; and
a substrate-supported three-dimensional (3-D) photoelectrode that includes:
an essentially two-dimensional (2-D) transparent zinc oxide electrode film disposed directly on a non-conductive substrate without a boundary layer therebetween, wherein said 2-D film is doped with at least one element selected from the group consisting of Al, Ga, and B; and
an array of single crystal essentially one-dimensional (1-D) nanostructures that are integral with said 2-D film and extend upwardly therefrom without a boundary layer therebetween, wherein said one or more 1-D nanostructures are not in direct contact with the substrate and are aligned normal to said 2-D film, wherein said nanostructures comprise a zinc oxide based alloy having a composition of $Mg_xZn_{1-x}O$, wherein $0<x<1$.

* * * * *